(12) United States Patent
Walker

(10) Patent No.: US 7,355,422 B2
(45) Date of Patent: Apr. 8, 2008

(54) OPTICALLY ENHANCED PROBE ALIGNMENT

(75) Inventor: Steven J Walker, Monrovia, CA (US)

(73) Assignee: Touchdown Technologies, Inc., Baldwin Park, CA (US)

( * ) Notice: Subject to any disclaimer, the term of this patent is extended or adjusted under 35 U.S.C. 154(b) by 191 days.

(21) Appl. No.: 11/369,343

(22) Filed: Mar. 6, 2006

(65) Prior Publication Data

US 2007/0063716 A1 Mar. 22, 2007

Related U.S. Application Data

(60) Provisional application No. 60/717,608, filed on Sep. 17, 2005.

(51) Int. Cl.
*G01R 31/02* (2006.01)
(52) U.S. Cl. ...................................... 324/754
(58) Field of Classification Search .................. None
See application file for complete search history.

(56) References Cited

U.S. PATENT DOCUMENTS

| | | | |
|---|---|---|---|
| 4,918,374 A | 4/1990 | Stewart et al. | |
| 5,657,394 A | 8/1997 | Schwartz et al. | |
| 6,023,172 A | 2/2000 | Krivy | |
| 6,118,894 A | 9/2000 | Schwartz et al. | |
| 6,239,590 B1 * | 5/2001 | Krivy et al. | 324/158.1 |
| 6,400,174 B2 * | 6/2002 | Akram et al. | 324/765 |
| 6,420,892 B1 * | 7/2002 | Krivy et al. | 324/758 |
| 6,710,798 B1 * | 3/2004 | Hershel et al. | 348/87 |
| 6,933,738 B2 | 8/2005 | Martin et al. | |
| 2003/0178988 A1 * | 9/2003 | Kim | 324/158.1 |
| 2007/0063716 A1 * | 3/2007 | Walker | 324/754 |
| 2007/0205782 A1 * | 9/2007 | Walker | 324/754 |
| 2007/0216431 A1 * | 9/2007 | Tunaboylu et al. | 324/754 |
| 2007/0245552 A1 * | 10/2007 | Caldwell et al. | 324/754 |

* cited by examiner

Primary Examiner—Jermele Hollington
(74) Attorney, Agent, or Firm—Marvel F. de la Cerra

(57) ABSTRACT

A novel probe card that comprises a set of fiducials and a method for using the same are disclosed. The set of fiducials comprises a first fiducial and a second fiducial fixed relative to the probe card substrate. Comparing the relative positions of the fiducials determines whether the probes are in proper alignment. This can be performed by the unaided eye or by using a low powered microscope. This novel probe card may also be used with computer vision alignment methods, thus enhancing the speed and accuracy of the computer vision method.

23 Claims, 10 Drawing Sheets

OPTICALLY ENHANCED PROBE ALIGNMENT

This application claims benefit of U.S. Provisional Application 60/717,608 filed on Sep. 17, 2005.

BACKGROUND OF THE INVENTION

1. Field of Invention

The present invention relates to devices for testing semiconductor wafers and more particularly to a novel probe card for semiconductor wafer testing.

2. Background

Integrated circuits are made in a bulk parallel process by patterning and processing semiconductor wafers. Each wafer contains many identical copies of the same integrated circuit referred to as a "die." Semiconductor wafers must be tested before the die is cut into individual integrated circuits and packaged for sale. If defects are detected the defective die can be culled before wasting resources packaging a defective part.

To test a wafer, a probe card is commonly used which comes into contact with the surface of the wafer. The probe card generally contains three unique characteristics: (1) an XY array of individual probes that bend in the Z direction to allow contact with the die; (2) an electrical interface to connect the card to a circuit test apparatus; and (3) a rigid reference plane defined in such a way that the probe card can be accurately mounted in the same location on the wafer tester. FIG. 14 illustrates an array of generic probes (A) on a substrate (B). Probe tips (C) for each probe in the array (A) are allowed to bend in the Z direction (perpendicular to the substrate (B)). When the probe card is brought in contact with the die, the Z-direction bending allows for a solid contact with the probe tip (C). The probe card ultimately provides an electrical interface that allows a circuit test apparatus to be temporarily connected to the individual die. This method of die testing is extremely efficient because many die can be tested at the same time. To drive this efficiency even higher, probe card manufactures are making larger probe cards with an ever-increasing numbers of probes.

Probe cards have been manufactured in a variety of ways over the years. Historically, these cards were made by gluing or by manually clamping small wires to a rigid frame. This style of probe card was generally limited to large contact pads at widely spaced intervals. The probes could be manually manipulated to achieve their proper positional locations in X, Y, and Z. Another method of producing accurately located probes is to drill a substrate material with an array of holes and place the probes into the hole array.

As the semiconductor industry has continued to decrease the size of integrated circuits (and consequently the die size), both the contact pad size and their spacing have decreased accordingly. Thus, new manufacturing methods have utilized photolithographic and micro-machining techniques to very accurately position the probes within the needed tolerances and to pack more probes onto a single card. Current state of the art semiconductor manufacturing routinely produces contact pad sizes of 80 um with inter-pad spacing on a 100 um pitch. A current probe card may have as many as 5,000 or more individual probes that must accurately engage the contact pads. The XYZ positional accuracy required for each of the individual probes is on the order of ±15 um in all directions.

Semiconductor wafers are processed in such a way that the wafer surface is extremely flat and when these wafers are held in place for testing the probe card must present the probe tips so that all the probe tips contact the wafer at roughly the same time as the probe card is lowered onto the wafer. This is accomplished by achieving what is known as "tip planarity" on the probe card. The probe card is manufactured so that the individual probe tips are all equally spaced from the probe card reference surface. Generally the Z-axis position of the probes is determined by using a probe card analyzer to contact the probe card to a flat metal surface that is electrically grounded. The probe card is moved toward this surface while the electrical state of each probe is monitored. When a probe comes into contact with the metal surface the position of the probe card is recorded. This method is the industry standard for determining probe card planarity.

Determining the XY location of the probe is a much more complicated matter. A quick way to look for misalignment of a probe from its intended position is to place the probe card under a standard microscope and look for probes that look "out of place." The Z position is very difficult to determine using this method due the depth of focus for most microscope objectives. The XY location of each probe is far easier to see, but it is still very difficult to gauge how far each probe is from its correct location given the small dimensions. This inspection method can only find probes that are grossly out of XY alignment. Probes are generally spring structures with some flexibility in the plane of the probe substrate. As such, they can inadvertently bend away from their ideal intended orientation by normal use, misuse or damage.

To determine alignment, a technician generally begins by visually inspecting the probe cards and if the technician can see a problem with the unaided eye then there is a severe problem and the card must be pulled off the line to repair the problem. However, when the technician does not see a misalignment with the naked eye, he must make the decision as to whether to pull the probe card off the line. Of course the technicians can always opt to send the probe card to secondary inspection. This, however, is very labor intensive and costly—both in inspection costs and testing line downtimes. Also, the equipment needed for secondary inspection may not be available where the probe cards are being inspected, further aggravating costs and downtime. If the technician decides not to send the probe into secondary inspection, then a misaligned probe card may give false positives and reduce the testing line yield. In either scenario, faulty probe card inspection will reduce yield and increase costs of the testing process.

Several methods have been proposed to increase the accuracy of locating the exact XY probe position (and thus identifying misalignment) quickly and inexpensively. For example, U.S. Pat. No. 6,023,172, entitled "Light-Based Method And Apparatus For Maintaining Probe Cards" uses two intersecting light beams to define the proper location stability issues. It also requires a precision optical alignment system to determine proper alignment.

U.S. Pat. No. 4,918,374, entitled "Method And Apparatus For Inspecting Integrated Circuit Probe Cards" utilizes a computer-controlled table that moves in the X and Y directions. The table has various conductive areas. The probe card is dragged across the table so that the probe card probes make an electrical contact with the table. Misalignments are identified based on the conductive areas with which the probe card is making contact. This method requires a complicated and expensive apparatus.

U.S. Pat. No. 5,657,394 entitled "Integrated Circuit Probe Card Inspection System" and U.S. Pat. No. 6,118,894 entitled "Integrated Circuit Probe Card Inspection System"

use a video camera that is mounted on a XY translation stage to determine the actual location of the probe tip. These systems implement video processing algorithms to determine the XYZ position of each probe and can be quite accurate. This method very accurately determines the XY position of the probe but requires a very expensive probe card analyzer and can take up to several hours to get results. This method has the further drawback that debris on the probe tips can preclude the video processing system from resolving the true location of the centroid, which is required to begin individual probe inspection.

U.S. Pat. No. 6,933,738 entitled "Fiducial Alignment Marks On Microelectronic Spring Contacts" uses an alignment mark that is patterned during the same step as the feature to be aligned, thus the mark is fixed relative to the probe tip, and is further designed to be lower than the tip surface. The lower position makes the alignment mark less vulnerable to debris buildup. The probe cards implementing these marks are then scanned using conventional video algorithms. Thus, this method still has the drawbacks of video processing—i.e., they are expensive and very time consuming.

What is needed, therefore, is a method and apparatus that allows for quick and inexpensive inspection to identify misalignments on a probe card.

SUMMARY OF THE INVENTION

The present invention provides a probe card with a set of alignment marks. This set includes one alignment mark that is fixed relative to the probe and one that is fixed relative to the substrate. By comparing the positions of the alignment marks, it is possible to determine if the probe card contains probes that are misaligned. The novel probe cards can be used to effectively and efficiently determine whether the probe card should be inspected with more robust and time consuming methods. The alignment features may also be used to increase the efficiency and speed of conventional computer vision techniques.

DETAILED DESCRIPTION OF THE PREFERRED EMBODIMENT

What is described below is a novel probe card and method that provides an inspection that can determine, with greater accuracy whether to send the probe card to secondary inspection by using a set of fiducials. A fiducial is a mark used as a reference point. This novel probe card will decrease downtime, secondary inspection costs and increase yield by more effectively identifying misaligned probes. The probe card and method may assist a technician in rendering a more reliable initial assessment by allowing more accurate identification of misalignments, either with the naked eye or by using a low powered microscope. If, after inspection of a probe card incorporating the probe card and method described herein, the technician continues to identify misalignments, then secondary inspection is likely necessary because the misalignments are likely large and would potentially affect the efficiency of the assembly line. The probe card and method can also be used in conjunction with current computer vision methods to make them more robust, accurate and faster. In the detailed description that follows, like element numerals are used to describe like elements shown in one or more of the figures.

Figure 1:
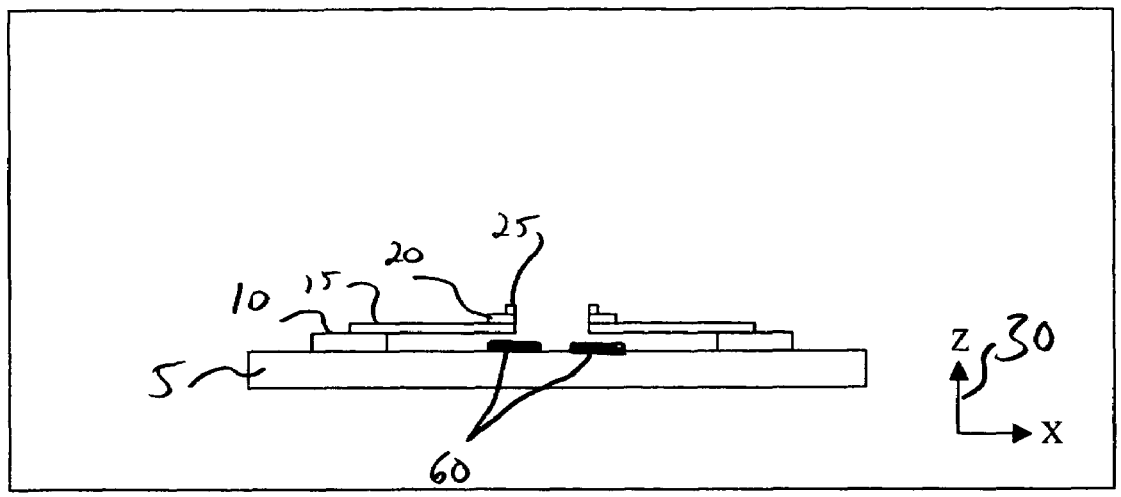
FIG. 1 is a cross-sectional view of the novel probe card with a set of fiducials.

Referring now to FIG. 1, a set of fiducials is used to determine misalignment of the probes. FIG. 1 depicts a cross sectional view of the novel probe card showing the substrate 5, probe base 10, bending element 15, tip supporting structure 20, probe tip 25 and a fiducial pattern 60 fixed relative to the substrate 5. Elements 10, 15, 20 and 25 are collectively referred to herein as the probe structure and form the first fiducial. Thus, the set of fiducials comprises the first fiducial, which is the probe structure itself, and a second fiducial pattern 60 placed on the substrate. The probe tip 25 (also called a pad) is necessarily spaced apart from the substrate 5 so that the probe structure has clearance to deform in the Z-direction 30 during the wafer test operation. The fiducial pattern 60 is applied to the substrate 5 of the probe card in such a way that it can be seen when the probe card is examined under an optical microscope. During inspection, this pattern 60 can be fully visible, fully hidden by the probe or partially hidden by the probe.

Figure 2:
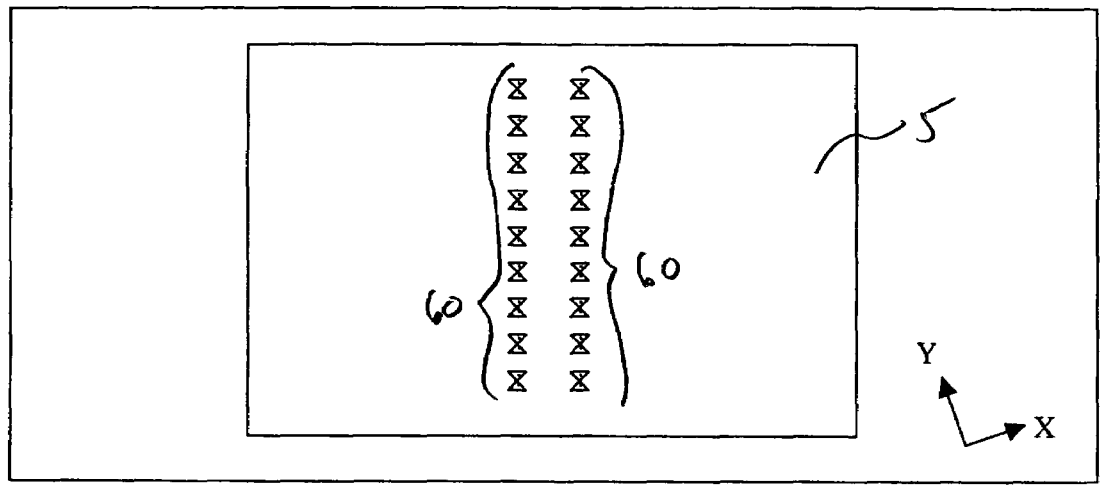
FIG. 2 is a plan view of the novel probe card substrate that shows the substrate, and the fiducial alignment pattern.
Figure 3:
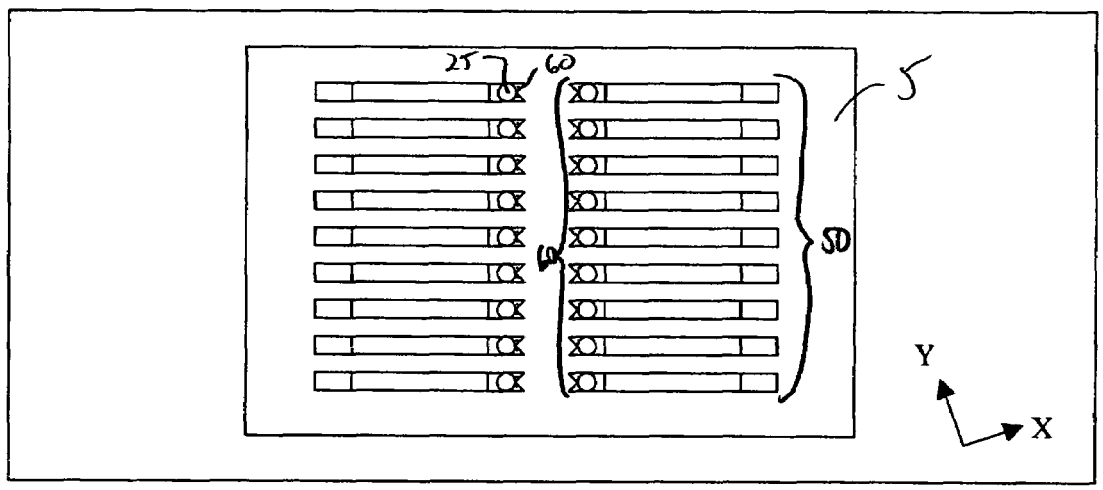
FIG. 3 is a plan view of the novel probe card element that shows the substrate, probe structures and the fiducial alignment pattern on the substrate.
Figure 4:
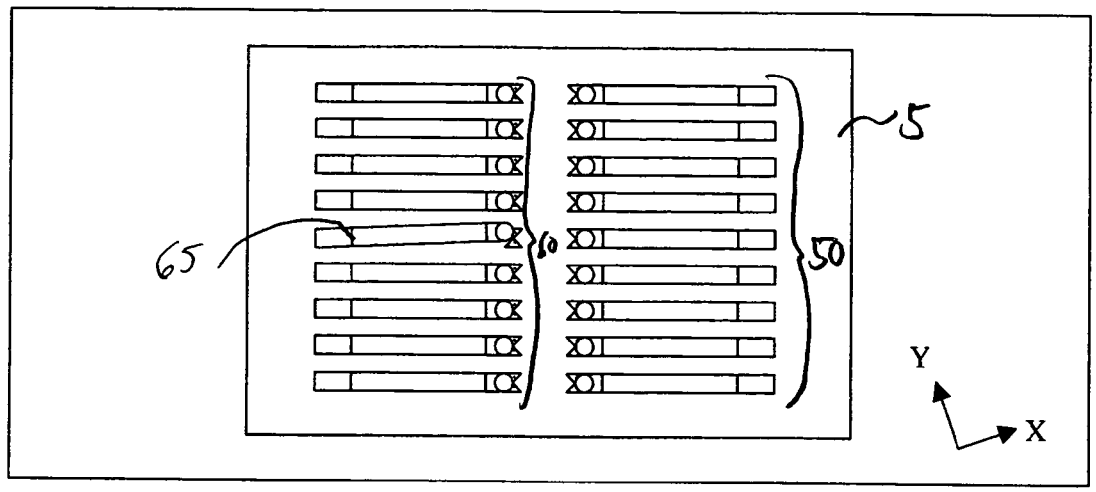
FIG. 4 is a plan view of the novel probe card, wherein a probe is misaligned relative to the fiducial alignment pattern on the substrate.

Upon examination of the probes, any probe that is misaligned, with respect to the intended position, will also be misaligned with the fiducial pattern 60 that is visible when looking in the Z-direction 30. In FIG. 2 a fiducial pattern 60 is photolithographically applied to the substrate 5, which is spaced apart from the probe structure. The fiducial pattern 60 is arranged in this embodiment so that it is spaced apart from the probe so that, if the probe is misaligned, the combination of the probe 65 and the fiducial pattern 60 will appear non-symmetrical (See FIGS. 4 and 7). In this embodiment the set of fiducials is the probe structure and the fiducial pattern 60. FIG. 3 shows the combination of the array of probes 50 and the fiducial pattern 60 as seen from above. The probe tips 25, when properly aligned to the fiducial pattern 60, form a predefined pattern. Although the predefined pattern is symmetrical in this embodiment, it need not be. FIG. 4 illustrates the same combination of the probe array 50 and fiducial patterns 60 as illustrated in FIG. 3. However, in this figure, one probe 65 in the array 50 is misaligned. The asymmetry caused by the misalignment is readily visible under microscopic examination.

Figure 5:
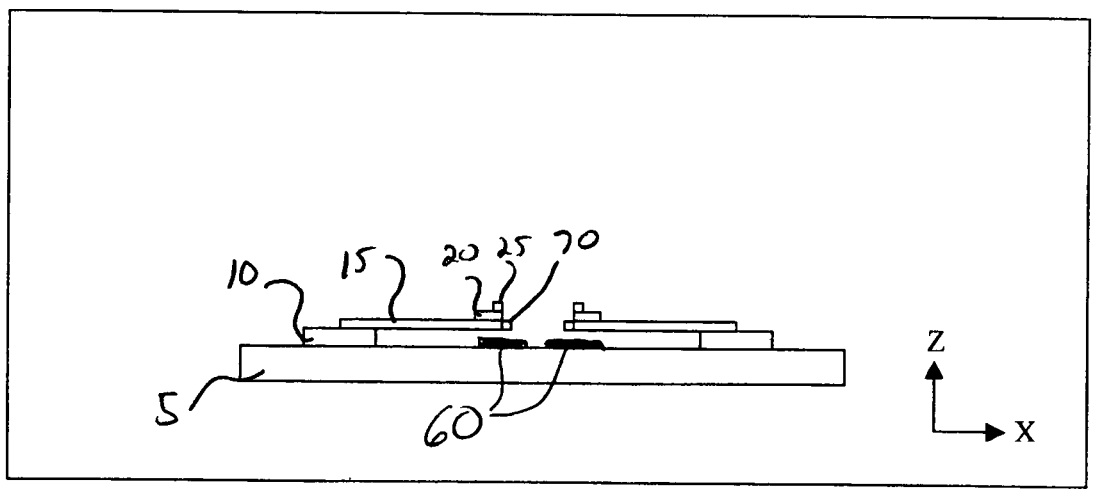
FIG. 5 is a cross-sectional view of the novel probe card with a set of fiducials, including an additional fiducial feature.
Figure 6:
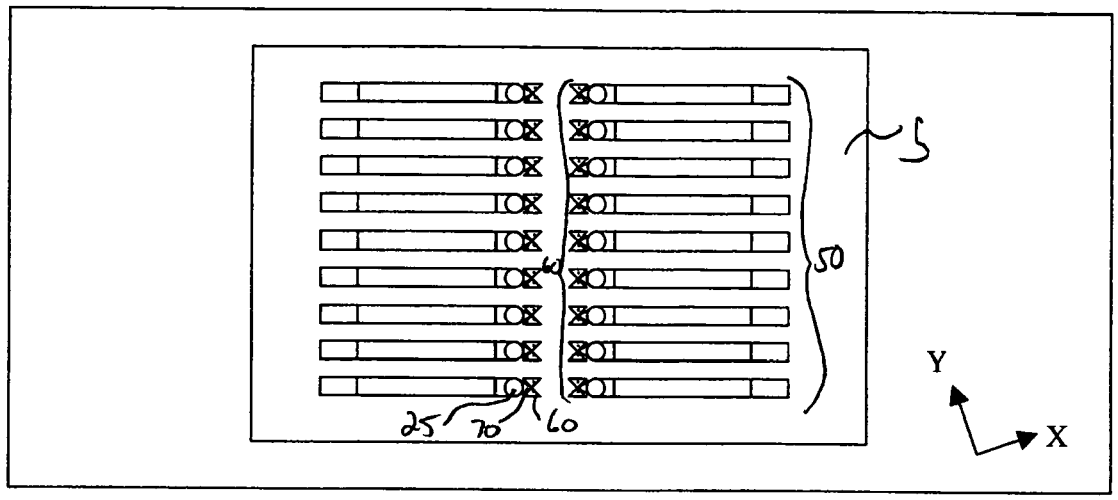
FIG. 6 is a plan view of the novel probe card element that shows the substrate, probe structures, the fiducial alignment pattern on the substrate and the additional fiducial feature.
Figure 7:
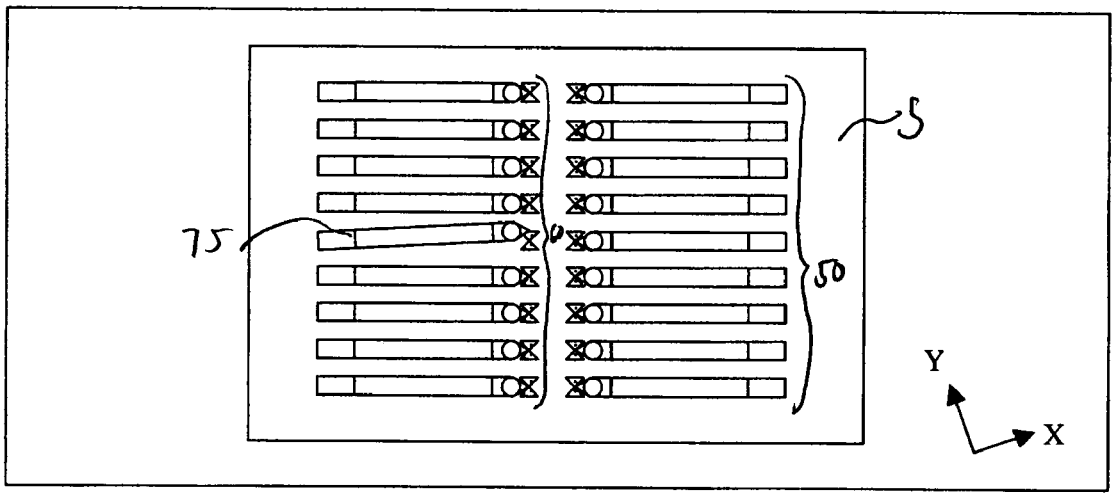
FIG. 7 is a plan view of the novel probe card, wherein a probe is misaligned relative to the fiducial alignment pattern on the substrate.

In another embodiment, the first fiducial comprises an additional fiducial feature that is added to the probe structure to assist in more precise alignment. FIG. 5 illustrates the same probe arrangement as shown in FIG. 1 with the addition of a fiducial feature 70 intended to provide a first fiducial to be used with the photolithographically applied second fiducial pattern 60 on the substrate 5. FIG. 6 shows the combination of the probe array 50 with the additional fiducial feature 70 and the fiducial pattern 60 as seen from above. Both the additional fiducial feature 70 and the fiducial pattern 60 form the set of fiducials needed to identify misalignment. The probe tips 25, when properly aligned to the additional fiducial features 70, form a symmetric pattern. FIG. 7 shows the same combination of the probe array 50 with the additional fiducial features 70 and fiducial pattern 60 as in FIG. 7. However, in this figure one probe 75 in the array 50 is misaligned. The asymmetry caused by the misalignment is readily visible under microscopic examination.

FIGS. 4 and 7 demonstrate a stark misalignment of the probes 65 and 75. While the misalignment is very easy to identify in these figures, in practice it may not be so apparent. Probe cards are usually designed to match the semiconductor wafer they are testing, resulting in cards that are often not perfectly symmetrical with repeating patterns. So, a technician would not have the benefit of relying on symmetrical patterns to determine the misalignments. This makes it difficult for a technician to identify misalignments with the human eye, often forcing potentially unnecessary secondary inspections. To overcome this problem, in one embodiment, a more sophisticated set of fiducials allows a technician to discern an aligned probe from a misaligned one by relying on contrast and displacement patterns. The human eye is able to quickly and effectively identify these patterns.

Figure 8:
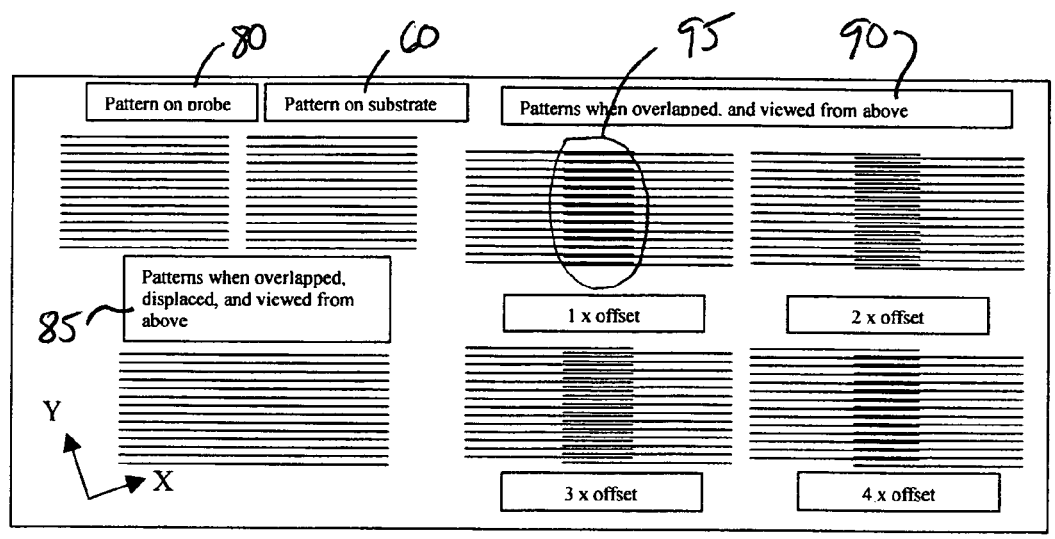
FIG. 8 is a plan view of various depictions of the novel probe card that use the 1-Dimensional interference effect.
Figure 9:
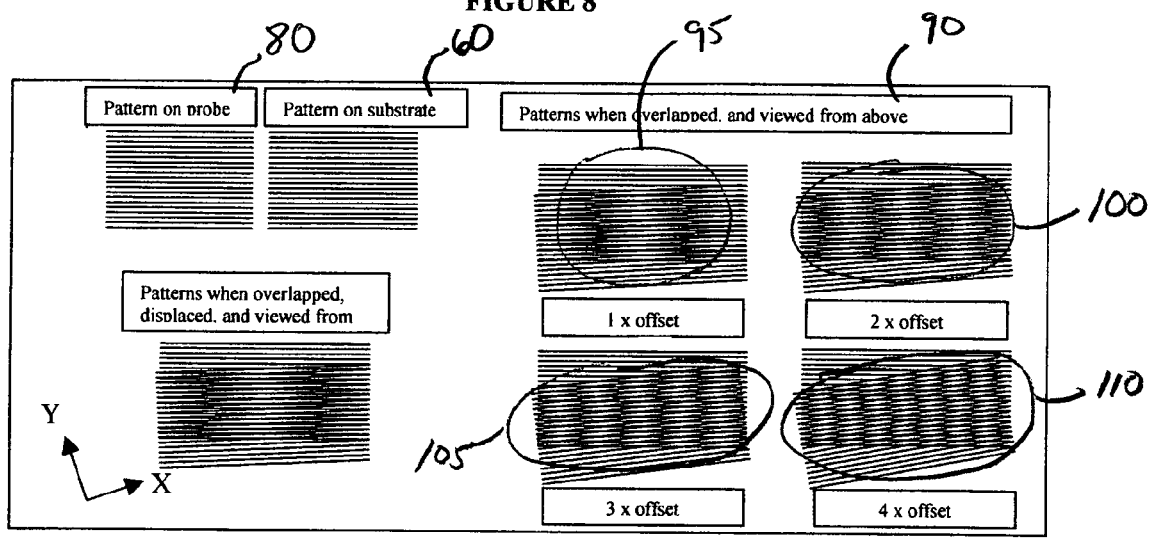
FIG. 9 is a plan view of various depictions of the novel probe card that use the 2-Dimensional interference effect.

Referring to contrast patterns, a set of fiducials may result in the Morie effect patterns—i.e., constructive interference patterns. For example, in one embodiment the first fiducial is the probe structure itself and the second fiducial is a pattern printed on the substrate. FIGS. 8 and 9 are simplified views of the patterns that might emerge which indicate misalignment. FIG. 8 is a representation of patterns that might emerge if the misalignment is only in one orthogonal direction and this representation shows the interaction of two separate periodic structures when superimposed on one another. The set of fiducials is the probe structure 80 and the fiducial pattern 60 printed on the substrate. If the probe structure 80 and pattern 60 are aligned, then the pattern on the left 85 emerges. However, when there is a misalignment, the patterns on the right 90 emerge. When the two patterns are superimposed they create an interference pattern 95 that can be used to determine if the probe structure 80 is aligned properly with the fiducial pattern 60.

FIG. 9 shows the same application of interference as illustrated in FIG. 8 but in two dimensions. This allows a Morie pattern 95 to develop and indicates the degree of probe alignment. Note that the more severe the misalignment the more constructive interference patterns that emerge 95, 100, 105 and 110.

Figure 10:
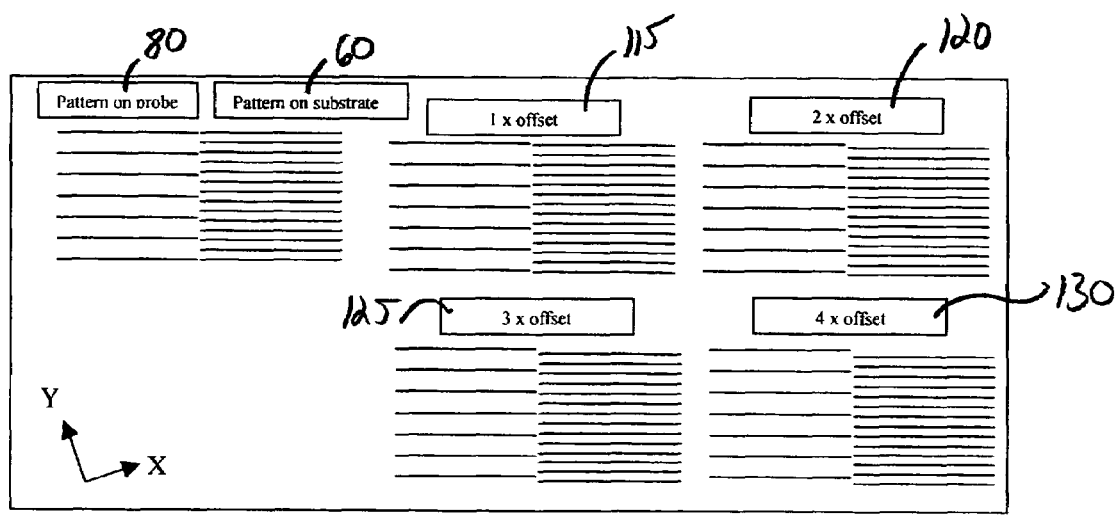
FIG. 10 is a plan view of various depictions of the novel probe card that use the Vernier effect.

The Vernier effect relies on disjointed patterns. When two periodic structures of different periods are aligned, they can be used together to determine the relative displacement of the structures. Referring to FIG. 10, the first fiducial is the probe structure 80 itself and the second is a fiducial pattern 60 printed on the substrate. The displacement of the first fiducial 80 to the second 60 can be recorded to a higher degree of precision than the patterning of any of the individual markings. The amount of misalignment is read by identifying the two lines on each scale that most closely match in horizontal position. In the example labeled 1× Offset 115, the scale on the right is offset one position toward the bottom and the lines that most closely match are Left2-Right3. In the 2× Offset 120 example, the scale on the right is offset two positions toward the bottom and the lines that most closely match are Left3-Right5. In 3× Offset 125 example, the scale on the right is offset three positions toward the bottom and the lines that most closely match are Left4-Right7. Finally, in the 4× Offset 125 example, the scale on the right is offset four positions toward the bottom and the lines that most closely match are Left5-Right9. Because of these two disparate scales, a trained technician looking at these offsets will be able to determine the degree of the alignment. The degree may be important in determining whether the probe card should be taken off-line or even whether the card can be repaired.

Figure 11:
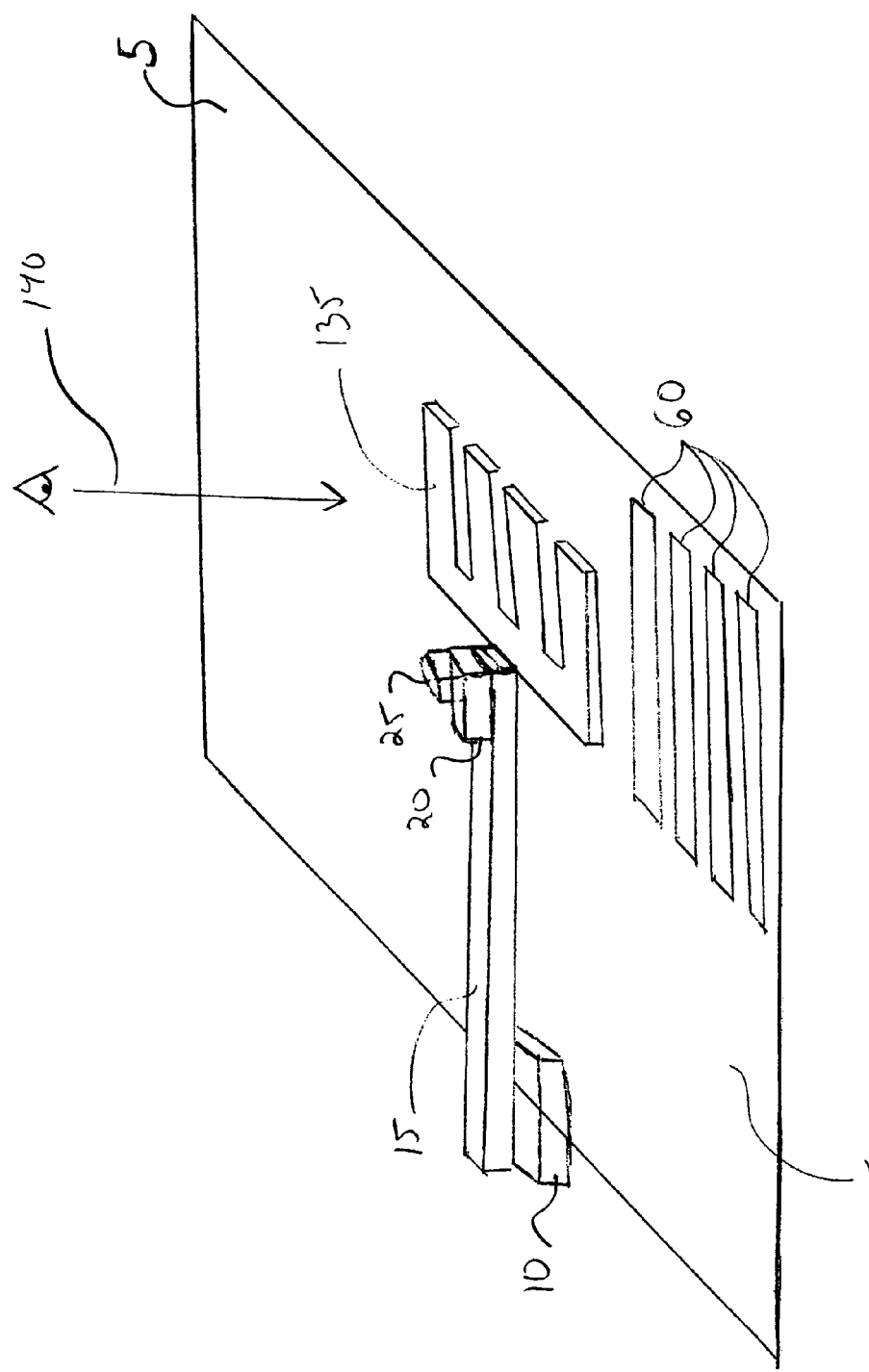
FIG. 11 is a plan view of a probe structure with a sophisticated set of fiducials.

Incorporating a more sophisticated set of fiducials can increase the accuracy in identifying misalignments. For example, FIG. 11 illustrates a sophisticated first fiducial 135 and a second fiducial pattern 60 printed on the substrate. The first fiducial 135 is extending past the bending element 15 and is fixed relative to the tip supporting structure 20, and the probe tip 25. By looking through the first fiducial 135 in a direction 140 that is perpendicular to the plane of the substrate 5, a technician can determine misalignment. Because the more sophisticated first fiducial 135 is depicted as a fork-like structure with four tines, the technician has four more structures per probe to assist in identifying and measuring the degree of a misalignment. While the first fiducial 135 is illustrated as a fork, it will be apparent to one skilled in the art that a variety of structures can be used to increase the accuracy in identifying misalignments.

In the embodiments described above, the set of fiducials is preferably incorporated during the photolithographic process. Probe card manufacturing techniques generally use photolithography techniques that begin by depositing a layer of conductive metal several nanometers thick on the substrate. Photoresist is then applied on top of the metal layer. A photomask is used to selectively expose the photoresist to light that causes it to harden. The substrate, complete with the layer of metal, is chemically treated to remove the unhardened photoresist and then the exposed metal is etched away. The hardened photoresist is then removed through another chemical treatment, leaving a substrate with metal in the same shape as the mask. There are different photolithographic techniques available, such as a negative photoresist that results in an inverse of the mask; it would be apparent to one skilled in the art to apply these other techniques. The photolithographic process is repeated several times to build up the desired structure. Each layer is aligned using alignment marks placed on top of each other throughout the process; this results in structures that are aligned within very tight tolerances.

By incorporating the fiducials as a feature in the photolithographic process, the fiducials also enjoy alignment to very tight tolerances. These tolerances translate into a fiducial set that can be used not only to identify misalignments, but also to assist in correcting the alignment to within the same tolerances of the original photolithographic manufacturing.

Figure 12:
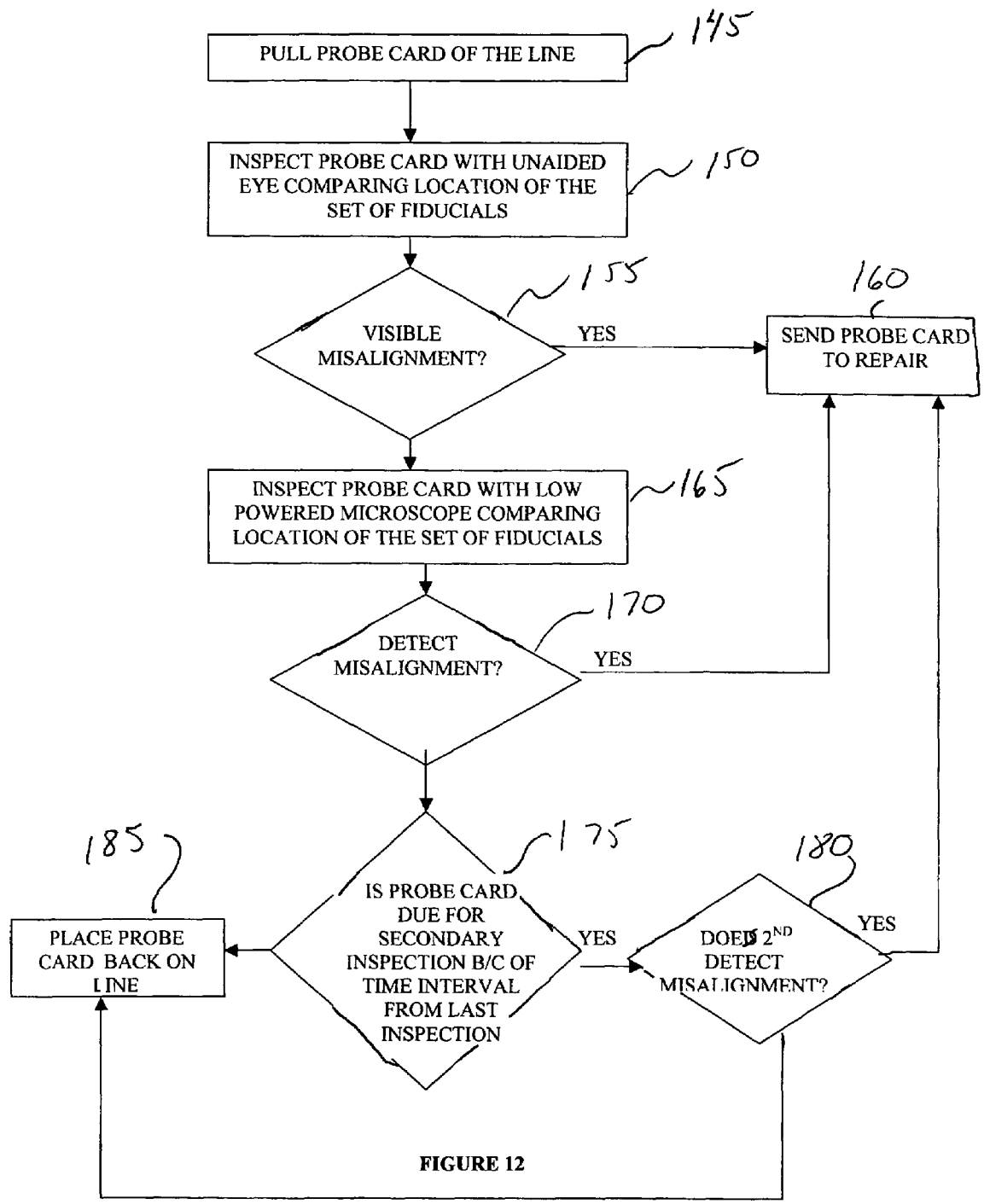
FIG. 12 is a process chart for using the novel probe card in determining the alignment of probes.

Now a method for using the novel probe card will be described. Referring to FIG. 12, a probe card may be pulled of the testing line and inspected for alignment 145. The technician may first inspect the card with the unaided eye to detect any obvious misalignment 150. Should such a misalignment exists the card should be repaired 155 and 160. If there are no obvious misalignments, then the technician may inspect the probe card with the aid of a low powered microscope 165. If, at this step, the technician detects a misalignment, then the probe card should be repaired 170 and 160. If the microscopic inspection did not detect a misalignment, it is still possible that the probe card is misaligned give the extremely small tolerances and the possibility of technician error. Given that the more the probe card is used, the more likely it will become misaligned, one possible way of determining whether secondary inspection is necessary is to look at the time interval since the last secondary inspection. If the interval passes a predefined period, then secondary inspection may be necessary 175 and 180. Secondary inspection may reveal that the probe card is properly aligned and therefore the probe card should be placed back on line 185. Or, secondary inspection may detect some misalignments that require repair 160. Ultimately, this method assists a technician in rendering a more reliable initial assessment by allowing a more accurate identification of misalignments, either with the naked eye or by using a low powered microscope. A more accurate inspection may increase the efficiency of the assembly line.

Figure 13:
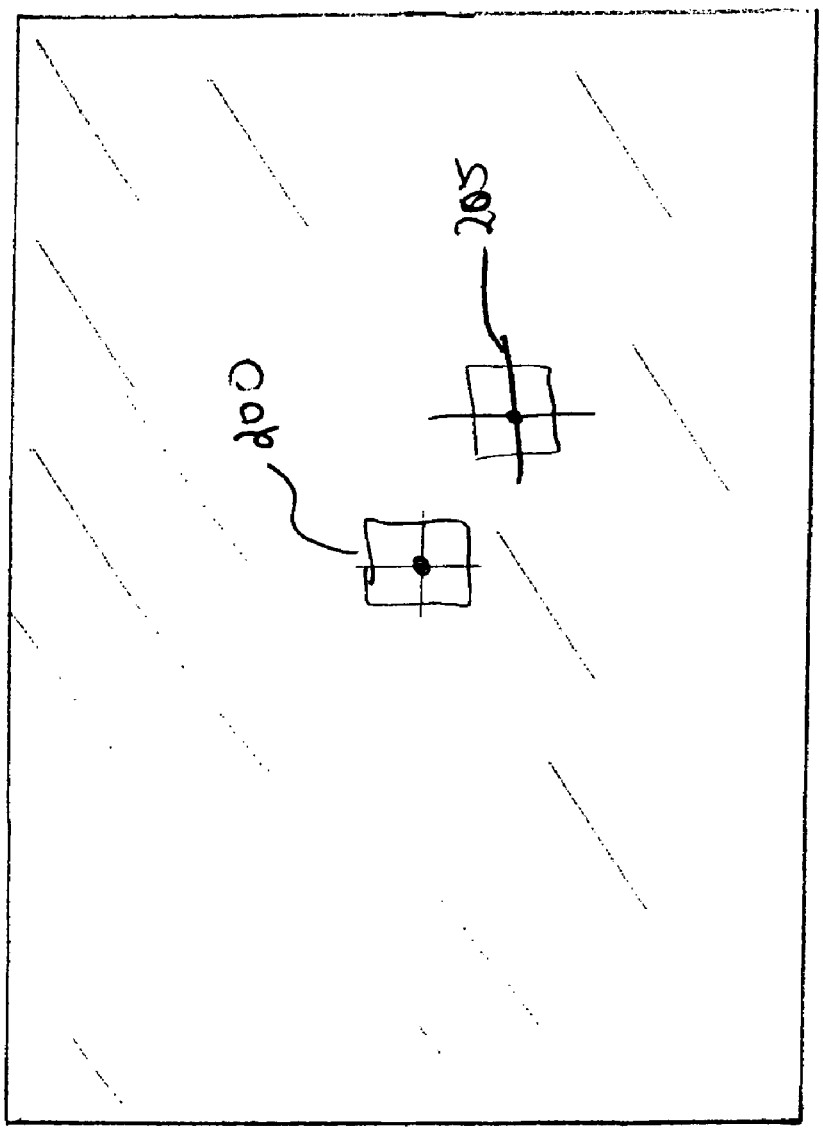
FIG. 13 is an illustration of a properly and improperly calculated centroid.
Figure 14:
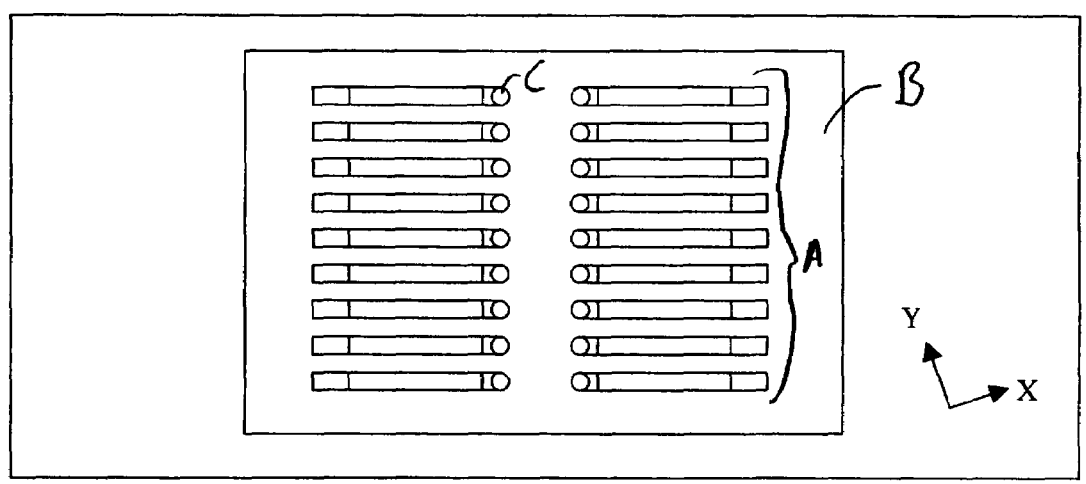
FIG. 14 is a plan view of a generic probe card.

The embodiments described above would also render computer vision inspection methods more robust and efficient. Current computer vision inspection systems have at least two deficiencies: they have difficulty locating a starting point, which prevents an accurate alignment inspection, and they are slow. A computer vision system begins its inspection by locating the centroid of the probe card. A centroid is essentially a point of reference that computer implemented algorithms rely on to begin inspection. Because the probe cards are exposed to heavy use, they can become dirty. This obstructs the patterns on which the computer vision system relies to determine a centroid. Referring to FIG. 13, a properly calculated centroid may be at point 200, while an improperly calculated centroid may be at position 205. If the computer assisted algorithm incorrectly determines the centroid (i.e., position 205), then the resulting inspection may yield faulty results. Even if the computer accurately determines the centroid, the calculation often takes very long. The computer must inspect each probe, which takes about 500 milliseconds per probe. And with a probe card carrying upwards of 5000 probes, inspecting the entire card could take over forty minutes of computer time. Using the above embodiments along with current computer vision inspection systems would significantly reduce this time. The computer could use the fiducial to more accurately determine the centroid, and then to individually determine alignment on each probe.

Having described the novel probe card and method in detail and by reference to preferred embodiments thereof, it will be apparent that modifications and variations are possible without departing from the scope of the invention defined in the following claims. Those modifications may include more sophisticated patterns on the substrate and more sophisticated fiducials on the probe structure.

The invention claimed is:

1. A probe card for testing semiconductor wafers, comprising:
   a substrate;
   a probe structure connected to the substrate;
   a fiducial set for determining alignment of the probe structure, wherein the set contains a first fiducial and a second fiducial;
   the first fiducial comprises the probe structure;
   the second fiducial comprises a pattern spaced apart from the first fiducial, and wherein the second fiducial is fixed relative to the substrate; and
   wherein alignment is determined by comparing the location of the first fiducial to the location of the second fiducial.

2. The probe card of claim 1, wherein the first fiducial further comprises an additional alignment structure, wherein the additional alignment structure's primary purpose is to assist in determining alignment.

3. A probe card for testing semiconductor wafers, comprising:
   a substrate;
   a fiducial set, wherein the set comprises a first fiducial and a second fiducial, wherein the second fiducial is fixed relative to the substrate and spaced apart from the first fiducial;
   wherein alignment is determined by comparing the location of the first fiducial to the location of the second fiducial.

4. The probe card of claim 3 wherein the first fiducial is comprised of the probe structure.

5. The probe card of claim 3 wherein the first fiducial is comprised of an additional alignment structure.

6. The probe card of claim 5, wherein the additional alignment structure is comprised of more than one structure.

7. The probe card of claim 3 wherein second fiducial is comprised of a photolithographically incorporated pattern.

8. The probe card of claim 7 wherein the pattern's primary purpose is to assist in determining alignment.

9. The probe card of claim 3 wherein the fiducial set is symmetrical.

10. The probe card of claim 7 wherein the fiducial set implements one-dimensional constructive interference patterns, wherein these interference patterns assist in determining alignment.

11. The probe card of claim 7 wherein the fiducial set implements two-dimensional constructive interference patterns, wherein these interference patterns assist in determining alignment.

12. The probe card of claim 11 wherein the interference patterns further assist in determining the degree of alignment.

13. The probe card of claim 7 further wherein the first fiducial is comprised of a first pattern that repeats with a first period; wherein the photolithographic pattern repeats with a second period; wherein the first period is different from the second period; and wherein the difference between the periods assist in determining alignment.

14. The probe card of claim 13 wherein the periods further assist in determining the degree of alignment.

15. The probe card of claim 3 further comprising:
   a computer vision system, wherein the computer vision system uses the first and second fiducials to determine alignment.

16. A computer vision system for determining the alignment of a probe card that comprises a set of fiducials, the system comprising:
   a video input device;
   software that implements a probe alignment program, wherein the program uses as an input the location of the set of fiducials, wherein the set of fiducials is comprised of:

a first fiducial;

a second fiducial fixed relative to a substrate and spaced apart from the first fiducial;

wherein the program calculates a centroid using the location of the set of fiducials.

17. The computer vision system of claim 16 wherein the program further compares the location of the first fiducial to the location of the second fiducial to determine a degree of alignment.

18. A method of determining the degree of alignment of a probe card comprising:
 (a) providing a probe card that comprises a first fiducial and a second fiducial fixed relative to a substrate and spaced apart from the first fiducial; and
 (b) determining alignment by comparing the location of the first fiducial to the location of the second fiducial.

19. The method of claim 18 wherein the determination step (b) further comprises using a low powered microscope.

20. The method of claim 18 wherein the determination step (b) further comprises using a computer vision system.

21. The method of claim 18 wherein the first fiducial is comprised of the probe structure.

22. The method of claim 18 wherein the first fiducial is comprised of an additional alignment structure.

23. The method of claim 18 wherein the second fiducial is comprised of a photolithographically incorporated pattern.

\* \* \* \* \*